United States Patent
Blumhagen et al.

(10) Patent No.: US 9,880,249 B2
(45) Date of Patent: Jan. 30, 2018

(54) METHOD FOR DETERMINING DISTORTION-REDUCED MAGNETIC RESONANCE DATA AND MAGNETIC RESONANCE SYSTEM

(71) Applicant: SIEMENS AKTIENGESELLSCHAFT, Munich (DE)

(72) Inventors: Jan Ole Blumhagen, Erlangen (DE); Stephan Kannengießer, Wuppertal (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 1242 days.

(21) Appl. No.: 13/922,321

(22) Filed: Jun. 20, 2013

(65) Prior Publication Data

US 2014/0009153 A1    Jan. 9, 2014

(30) Foreign Application Priority Data

Jul. 3, 2012 (DE) ......................... 10 2012 211 471

(51) Int. Cl.
  *G01V 3/00*  (2006.01)
  *G01R 33/565*  (2006.01)
  *G01R 33/563*  (2006.01)

(52) U.S. Cl.
  CPC ..... *G01R 33/565* (2013.01); *G01R 33/56391* (2013.01); *G01R 33/56383* (2013.01); *G01R 33/56563* (2013.01); *G01R 33/56572* (2013.01)

(58) Field of Classification Search
  CPC .............................................. G01R 33/56391
  (Continued)

(56) References Cited

U.S. PATENT DOCUMENTS 4,770,182 A * 9/1988 Damadian ............ A61B 5/0555
                                                        324/306
5,613,492 A * 3/1997 Feinberg .......... G01R 33/56509
                                                        324/307

(Continued)

FOREIGN PATENT DOCUMENTS

CN       102007422 A      4/2011
DE    102005018939 A1    11/2006
(Continued)

OTHER PUBLICATIONS

Chinese Office Action and English translation thereof dated Jan. 14, 2016.

(Continued)

*Primary Examiner* — Louis Arana
(74) *Attorney, Agent, or Firm* — Harness, Dickey & Pierce, P.L.C.

(57) ABSTRACT

Various embodiments relate to a method for determining distortion-reduced magnetic resonance data in a subarea of a magnetic resonance system located along a radial direction of the magnetic resonance system at the edge of a field of view of the magnetic resonance system. The method includes positioning the object to be examined at a first and a second position along an axial direction of the magnetic resonance system and acquiring first magnetic resonance data in the subarea at the first position and acquiring second magnetic resonance data in the same subarea at the second position. The method also includes determining distortion-reduced magnetic resonance data based on the first and second magnetic resonance data.

18 Claims, 8 Drawing Sheets

(58) Field of Classification Search
USPC .................................. 324/309, 307, 306
See application file for complete search history.

(56) References Cited

U.S. PATENT DOCUMENTS

| | | | |
|---|---|---|---|
| 5,633,585 A | 5/1997 | Kuhn | |
| 7,230,424 B1 | 6/2007 | Morrone | |
| 7,511,489 B2 * | 3/2009 | Fautz ................. | G01R 33/5611 |
| | | | 324/307 |
| 2006/0261810 A1 | 11/2006 | Fautz et al. | |
| 2009/0033327 A1 * | 2/2009 | Aldefeld .......... | G01R 33/56375 |
| | | | 324/309 |
| 2011/0034799 A1 | 2/2011 | Ogino | |
| 2012/0056621 A1 | 3/2012 | Blumhagen et al. | |
| 2012/0235680 A1 | 9/2012 | Blumhagen et al. | |
| 2012/0249141 A1 | 10/2012 | Blumhagen | |
| 2013/0057282 A1 | 3/2013 | Blumhagen et al. | |
| 2013/0082702 A1 | 4/2013 | Blumhagen et al. | |

FOREIGN PATENT DOCUMENTS

| | | |
|---|---|---|
| DE | 102010044520 A1 | 3/2012 |
| DE | 102011005728 A1 | 9/2012 |
| DE | 102011006436 A1 | 10/2012 |
| DE | 102011082266 A1 | 3/2013 |
| DE | 102011083898 A1 | 4/2013 |

OTHER PUBLICATIONS

Langlois S. et al., "MRI Geometric Distortion: A Simple Approach to Correcting the Effects of Non-Linear Gradient Fields", JMRI 9: pp. 821-831, 1999; 1999.

Reinsberg et al.: "A complete distortion correction for MR images: II. Rectification of static-field inhomogeneities by similarity-based profile mapping", in Phys.Med.Biol. 50 (2005), pp. 2851-2661; 2005.

Doran et al: "A Complete distortion correction for MR images: I. Gradient warp correction", Physics in Medicine and Biology 50, 2005, pp. 1343-1361; 2005.

* cited by examiner

METHOD FOR DETERMINING DISTORTION-REDUCED MAGNETIC RESONANCE DATA AND MAGNETIC RESONANCE SYSTEM

PRIORITY STATEMENT

The present application hereby claims priority under 35 U.S.C. § 119 to German patent application number DE 102012211471.8 filed Jul. 3, 2012, the entire contents of which are hereby incorporated herein by reference.

FIELD

Various embodiments of the invention generally relate to methods for determining distortion-reduced magnetic resonance (MR) data for at least one layer of an object to be examined in a subarea of an MR system, and/or an MR system. In particular, various embodiments relate to techniques in which the distortion-reduced MR data is determined for the subarea which is located at the edge of a field of view of the MR system.

BACKGROUND

Owing to physical and technical conditions, such as a limited homogeneity in the basic magnetic field and/or non-linearities of the gradient fields, the measurable volume in a magnetic resonance (MR) system is restricted in all three spatial directions. A scanning volume, what is known as a Field of View (FoV), is therefore limited to a volume in which the physical conditions mentioned above lie within specified tolerance ranges and therefore an image of the object to be examined which is true to the original is possible without significant local distortions. In other words, inhomogeneities in the basic magnetic field and non-linearities of spatially-encoding gradient fields are typically within a tolerance range in the field of view of the MR system, wherein the tolerance range is determined with respect to small distortions of MR data or for distortions which are not significant to applications.

From a geometrical perspective this field of view, in particular in the radial direction, i.e. in a transversal plane (for example in the x and y directions) perpendicular to a longitudinal axis (axial direction) of a tunnel or a tube of the MR system, is significantly smaller than the volume defined by the tunnel opening of the magnetic resonance system. In conventional magnetic resonance systems a diameter of the tunnel is by way of example 60 or 70 cm, whereas the diameter of the conventionally used field of view, in which the physical conditions mentioned above lie within the tolerance ranges, can be approximately 50 or 60 cm.

Acquired MR data can therefore exhibit distortions as a function of location. A distortion indicates a mismatch between a position of an image element in the MR data and the actual position of the image element in the object to be examined. In other words, the distortion describes a spatial imprecision in an MR image which is generated with the aid of MR data.

Many applications require high spatial precision, however, i.e. spatially precise imaging even outside of and adjoining the field of view: examples are a determination of a human attenuation correction for positron emission tomography (PET), MR-led interventions or applications in which spatially precise imaging methods, such as computed tomography (CT) or PET, are combined with MR methods.

The restriction that, in particular in the edge region of the tunnel of the MR system, comparatively severe distortions of the object being measured are possible, is conventionally avoided in the case of pure MRT imaging by arranging the corresponding test region of the object to be examined not at the edge of the tunnel but in a low-distortion region, for example as close as possible to the center of the tunnel, what is known as the isocenter of the magnetic resonance scanner. In conventional MR systems and in particular hybrid systems, such as a hybrid system comprising an MR system and a positron emission tomograph, what is known as an MR-PET hybrid system, it may, however, be desirable to determine structures in the subarea at the edge of the tube of the MR system as spatially precisely as possible as well. In an MR-PET hybrid system the human attenuation correction by way of example is critical. The human attenuation correction determines the intensity attenuation of the PET photons emitted after an interaction of positrons and electrons on their way to the detector through absorbent tissue, and corrects the received signal by precisely this attenuation. MR data is acquired for this which maps the complete anatomy of the object to be examined in the direction of the high-energy photons emitted by the positron emission tomography. This means that the anatomy of the object to be examined should also be captured as precisely a possible in the subarea at the edge of the tunnel of the hybrid system. In a patient to be examined the structures located in this subarea are primarily the arms by way of example.

Various correction algorithms are known in the prior art for correcting a distortion, in particular outside of the field of view, i.e. outside of the volume in which magnetic field inhomogeneity and non-linearity of the gradient field lie within specifications. Distortion-reduced MR data can be determined in this way. By way of example, a gradient distortion correction is proposed by S. Langlois et al. in "MRI Geometric Distortion: a simple approach to correcting the effects of non-linear gradient fields" (J. Magn. Reson. Imaging 1999, 9(6) 821-31) and by S. J. Doran et al. in "A complete distortion correction for MR images: I. Gradient warp correction" (Phys. Med. Biol. 2005 50(7) 1343-61). A correction of the basic magnetic field is proposed, moreover by S. A. Reinsberg et al. in "A complete distortion correction for MR images: II. Rectification of static-field inhomogeneities by similarity-based profile mapping" (Phys. Med. Biol. 2005 50(11) 2651-61).

The results of the proposed methods constitute comparatively complicated approaches, however, in particular for a distortion correction in the edge region. A subsequent correction may for example not be possible or only be possible to a limited extent. If, for example, the inhomogeneities in the basic magnetic field are so great that no clear frequency allocation can be ensured during the spatial encoding by means of gradient fields, it may be possible to correct errors resulting therefrom to only a limited extent after measurement.

SUMMARY

At least one embodiment of the present invention is directed to a method for determining distortion-reduced MR data which enables simple execution while simultaneously providing highly accurate determination.

Accordingly, one embodiment of the invention relates to a method for determining distortion-reduced MR data for at least one layer of an object to be examined in a subarea of an MR system. The subarea is located along a radial direction of the MR system at the edge of a field of view of the MR system. The method comprises positioning the object to be examined at a first position along an axial direction of the MR system and acquiring first MR data in the subarea for the at least one layer at the first position. The method also comprises positioning the object to be examined at a second position along the axial direction of the MR system, wherein the second position is different to the first position. The method also comprises acquiring second MR data in the same subarea for the at least one layer at the second position and determining the distortion-reduced MR data for the at least one layer based on the first and second MR data.

Accordingly, another embodiment of the invention relates to a magnetic resonance system with a scanning controller, which is configured to determine distortion-reduced MR data for at least one layer of an object to be examined in a subarea of an MR system, wherein the subarea is located along a radial direction of the MR system at the edge of a field of view of the MR system. The scanning controller is configured to carry out the following steps: positioning of the object to be examined at a first position along an axial direction of the MR system; acquiring first MR data in the subarea for the at least one layer at the first position; positioning the object to be examined at a second position along the axial direction of the MR system, wherein the second position is different to the first position; acquiring second MR data in the same subarea for the at least one layer at the second position; determining the distortion-reduced MR data for the at least one layer based on the first and second MR data.

BRIEF DESCRIPTION OF THE DRAWINGS

The above-described properties, features and advantages of this invention and the manner in which these are achieved will become clearer and more comprehensible in conjunction with the following description of the exemplary embodiments which are illustrated in more detail in connection with the drawings, wherein.

The present invention will be illustrated in more detail below with the aid of example embodiments and with reference to the drawings. Identical reference numerals denote identical or similar elements in the figures.

DETAILED DESCRIPTION OF THE EXAMPLE EMBODIMENTS

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

One embodiment of the invention relates to a method for determining distortion-reduced MR data for at least one layer of an object to be examined in a subarea of an MR system. The subarea is located along a radial direction of the MR system at the edge of a field of view of the MR system. The method comprises positioning the object to be examined at a first position along an axial direction of the MR system and acquiring first MR data in the subarea for the at least one layer at the first position. The method also comprises positioning the object to be examined at a second position along the axial direction of the MR system, wherein the second position is different to the first position. The method also comprises acquiring second MR data in the same subarea for the at least one layer at the second position and determining the distortion-reduced MR data for the at least one layer based on the first and second MR data.

In other words, the subarea can have a certain dimension along the axial direction, i.e. along the tube of the MR system, and extend for example so as to adjoin the field of view or surround this at relatively large radial distances. For example, the field of view may be arranged substantially spherically or elliptically about an isocenter of the MR system. The subarea can be an edge region within a tube of the MR system. The subarea can for example comprise inhomogeneities in the basic magnetic field and/or non-linearities of gradient fields which are greater than a threshold value which is determined for distortion-free MR data.

In other words, the first and second MR data can redundantly map the same region of the object to be examined, namely the at least one layer. Based on the information obtained it may be possible to determine the distortion-reduced MR data by way of the redundant acquisition of the information contained in the MR data for the at least one layer. Distortion-reduced can in this connection mean, for example in contrast to the first and/or second MR data, solely distortion-reduced, i.e. with low spatial imprecision of mapped objects in MR images which are obtained from the MR data. The field of view of the MR system can denote the region in which this distortion of MR data is already low without any additional steps.

A movement of the table and therewith a displacement of the object to be examined along the axial direction can occur for example between the first and second positions. The location within the MR system, at which the first MR data or the second MR data is acquired, can then be different in the first and second positions.

It is possible for example for the inhomogeneities in the basic magnetic field and/or the non-linearities of the spatially-encoding gradient fields to have a local dependence within the subarea of the MR system: the inhomogeneities in the basic magnetic field and/or the non-linearities of the spatially-encoding gradient fields can in particular have different values at the first and second positions at the respective location of the acquired MR data. Repositioning the object to be examined to acquire the first and second MR data respectively means that the effects of the inhomogeneities in the basic magnetic field and the non-linearities of the gradient fields on the distortion behavior of the first and second MR data is different in each case and advantageously cancel each other out or are destructively superimposed (for example elongation and compression, rotation in opposing directions, etc.). As a result it may be possible to determine the distortion-reduced MR data based on the information retrieval resulting therefrom comprising the first and second MR data. The first and second MR data can be acquired using conventional or any desired MR measuring sequences in this connection.

Therefore, a sign of inhomogeneities in a basic magnetic field at the respective location within the MR system, in which the first and second MR data respectively of the at least one layer are acquired, can be different in the first position and the second position; alternatively or additionally a sign of non-linearities of gradient fields at the respective location within the MR system, in which the first and second MR data respectively of the at least one layer are acquired, can be different in the first position and the second position.

In other words, it may be that the inhomogeneities in the basic magnetic field have a different and advantageously opposing phase for the first and second MR data respectively. It may also be that the non-linearities of the gradient fields have a different and advantageously opposing phase for the first and second MR data respectively. For example, it may be possible for inhomogeneities in the basic magnetic field, which have a different sign (i.e. a local increase or reduction in the basic magnetic field) to have precisely a different and opposing effect on the distortion behavior of the MR data. Purely by way of illustration, local increases in the inhomogeneities with a positive sign (randomly chosen) of the basic magnetic field can cause a distortion in the form of a compression of the mapped object to be examined in the acquired MR data, while local inhomogeneities in the basic magnetic field with a negative sign cause a distortion in the form of an elongation or pulling of the mapped object to be examined in the acquired MR data. Compression and elongation may be mutually complimentary distortions. This example is purely illustrative and other dependencies are possible. The distortion-reduced MR data can be determined in this way by combining the first and second MR data.

Above, the dependencies of the inhomogeneities in the basic magnetic field and the non-linearities of the gradient fields at the respective locations within the MR system, at which the first and second MR data are acquired at the first or second position, has been discussed qualitatively in relation to a sign. However, it may also be possible in various embodiments for the inhomogeneities in the basic magnetic field and the non-linearities of the gradient fields to have a certain quantitative connection at the respective location at the first and the second position. An embodiment of this kind will be described below.

In various embodiments an amount of inhomogeneities in a basic magnetic field in the first position and the second position can be equal within a tolerance range at the respective location within the MR system, in which the first and second MR data respectively of the at least one layer are acquired. At the respective location within the MR system, in which the first and second MR data respectively of the at least one layer are acquired, an amount of non-linearities of gradient fields may also be equal within a tolerance range in the first position and the second position.

If, for example, the amounts of the non-linearities of the gradient fields and the inhomogeneities in the basic magnetic field at the respective locations, at which the first and second MR data are acquired, are substantially equal (i.e. equal within the tolerance range), distortion behavior may also be substantially equally strong with mutually opposing dependency, i.e. for example compression and elongation by a comparable amount respectively or rotation in opposing directions about a comparable angle, etc. The tolerance range can, for example, be determined from a known effect of the inhomogeneities and non-linearities on the distortion behavior.

The method can also comprise providing data which describes inhomogeneities in the basic magnetic field and/or non-linearities of gradient fields within the subarea as a function of the position along the axial direction. The method can also comprise determining the first position and the second position with the aid of the provided data.

It may be possible for example to determine or measure the data in a calibration measurement and then store it. It may then be possible, within the framework of positioning of the object to be examined, to provide the previously stored data. It may also be possible, however, to measure the data itself within the framework of the inventive method. By providing the data it may be possible to carry out positioning such that the distortion-reduced MR data can be determined with high accuracy or with particularly reduced distortion.

In an alternative simple embodiment it may be possible to strictly predefine the first and second positions (for example in an MR system-specific single calibration). It may then not be necessary to provide the data relating to the inhomogeneities and/or non-linearities.

In various embodiments distortion behavior of the first MR data may be substantially cancelled out by distortion behavior of the second MR data.

For example, the first and the second position can be determined with the aid of the data, which describes the inhomogeneities and/or non-linearities, in accordance with this criterion. For example, the distortion behavior can be determined based on the data, which describes the inhomogeneities in the basic magnetic field and/or the non-linearities of the gradient fields. The distortion behavior can be described for example by a location transformation which describes the mis-mapping of an image element in MR-images which are obtained from the MR data. The first and second positions can then be determined such that these location transformations are cancelled out (are inverse to each other).

In various embodiments first and second MR data can be acquired at the first position and second positions for a large number of layers respectively with different spatially-encoding gradient fields.

For example, at the first and second positions first and second MR data respectively can be acquired for a large number of layers with different layer selection gradient fields. In this way it may be possible to acquire first and second MR data for the large number of layers, while only dual positioning (or at least a smaller number of positioning steps in comparison with the number of layers) is necessary. This may be the case for example in particular if a dependency of the inhomogeneities in the basic magnetic field and/or the non-linearities of the gradient fields is especially dependent on a relative spacing between the first and the second positions; at the same time, however, there is potentially only a lower dependency of the absolute position of the first and second positions within the MR system. It may namely be possible to acquire first and second MR data for the large number of layers with a substantially identical relative spacing between the respective locations in the MR system in the first and second positions respectively.

In this respect it may in particular be possible that the inventive method also comprises: determining the large number of layers based on a comparison of the provided data with a tolerance range of the inhomogeneities in the basic magnetic field and/or the non-linearities of the gradient fields for each layer of the large number of layers respectively.

In other words, it may for example be possible, to determine for example in relation to the relative dependencies, described above, in relation to sign and amount of the inhomogeneities in the basic magnetic field and/or the non-linearities of the gradient fields, the layers for which the acquisition of the first and second MR data at the first and second positions enables determination of the distortion-reduced MR data. If namely, for example for certain layers, the sign of the inhomogeneities in the basic magnetic field and/or the non-linearities of the gradient fields no longer assume different values, it may not be possible, or may be possible to only a limited extent, to determine the distortion-reduced MR data. In such a case it may be preferable to carry out renewed positioning of the object to be examined (for example in a third position etc.) in such a way that the first and second MR data can be acquired for each of the large number of layers so as to meet this boundary condition. Individual layers can then be acquired at the determined positions. The same applies in relation to the amount of inhomogeneities in the basic magnetic field and/or the amount of non-linearities of the gradient fields, as illustrated above.

In various embodiments it may be possible that positioning of the object to be examined and acquisition of the first and second MR data for the at least one layer occurs by means of a continuous table movement. In this way it may be possible for example that the first and second data are acquired at the same or substantially the same location within the MR system for each layer. This may be the case if positioning and acquisition of the first and second MR data are coordinated with each other.

In various embodiments it is possible that determining the distortion-corrected MR data includes a weighted averaging of the first and second MR data. For example, the weight of the weighted averaging can take into account a known severity of the non-linearities of the gradient fields and/or the inhomogeneities in the basic magnetic field. It may be possible for example to determine a weighting factor of the weighted averaging based on the provided data which describes the inhomogeneities in the basic magnetic field and/or the non-linearities of the gradient fields. The weighting factor can for example take into account the distortion behavior of the first and second MR data.

Accordingly, another embodiment of the invention relates to a magnetic resonance system with a scanning controller, which is configured to determine distortion-reduced MR data for at least one layer of an object to be examined in a subarea of an MR system, wherein the subarea is located along a radial direction of the MR system at the edge of a field of view of the MR system. The scanning controller is configured to carry out the following steps: positioning of the object to be examined at a first position along an axial direction of the MR system; acquiring first MR data in the subarea for the at least one layer at the first position; positioning the object to be examined at a second position along the axial direction of the MR system, wherein the second position is different to the first position; acquiring second MR data in the same subarea for the at least one layer at the second position; determining the distortion-reduced MR data for the at least one layer based on the first and second MR data.

Effects can be achieved with such an MR system which are comparable to the effects which can be achieved for a method for determining distortion-reduced MR data according to a further aspect of the invention. The features described above and those below and embodiments of the invention may be combined; in particular combinations which have are not explicitly cited are also possible.

Figure 1:
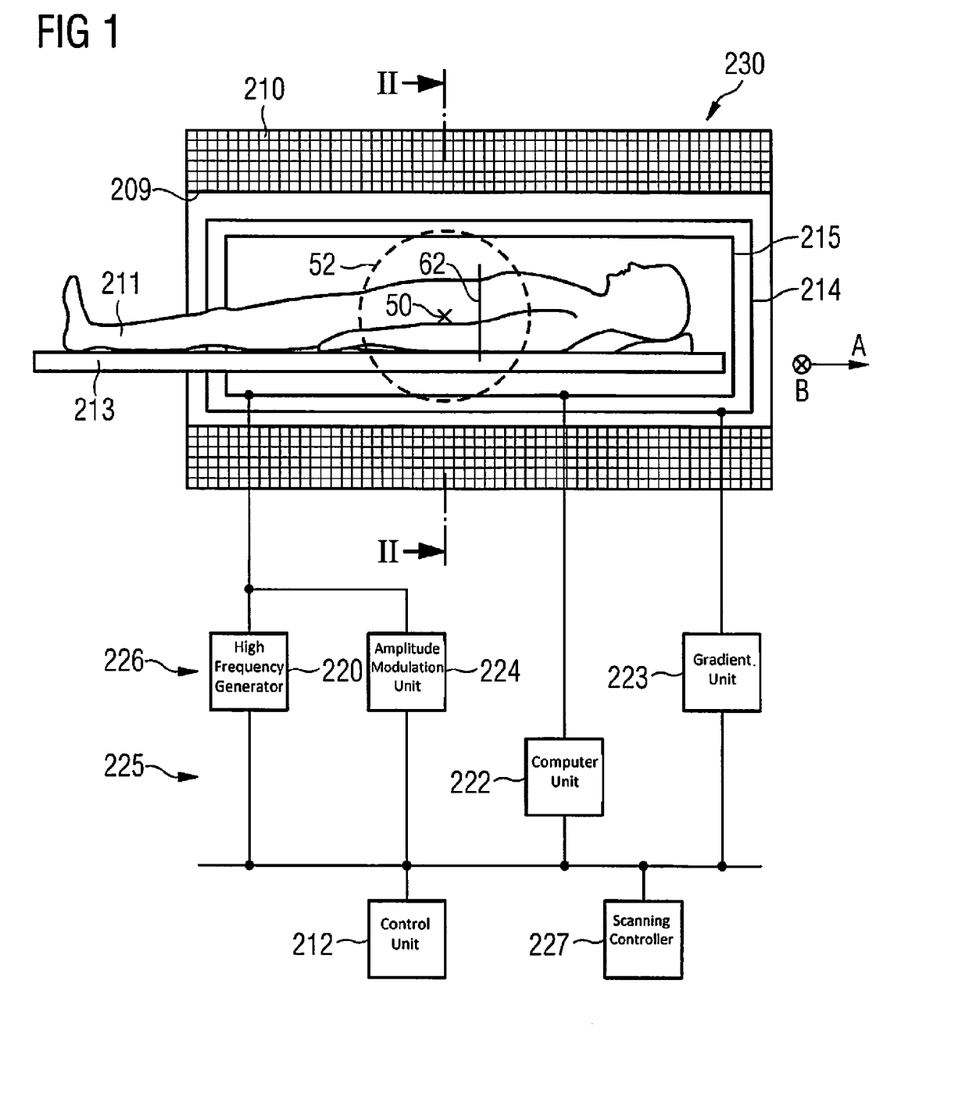
FIG. 1 shows a schematic view of an inventive MR system.

FIG. 1 schematically shows a magnetic resonance (MR) system 230 according to an embodiment of the present invention. The MR system 230 comprises a magnet 210 for generating a basic magnetic field. The magnet 210 can be for example a tubular magnet and the basic magnetic field can be parallel to the longitudinal axis (axial direction A) of the tube 209. The basic magnetic field is used to align nuclear spin in the object to be examined 211. Ideally a constant basic magnetic field is used. It may, however, be possible for the basic magnetic field to exhibit local inhomogeneities owing to technical limitations of the magnet 210 and/or susceptibility artifacts. The homogeneity of the basic magnetic field can lie within a field of view 52 of the MR system 230 within a range suitable for measuring, i.e. within certain specifications equal to a nominal value. The field of view includes an isocenter 50 of the MR system 230, which, for example, can be coincident with or be close to the geometric center of the tube 209.

An object to be examined, here a person being examined 211, can be pushed on a table 213 into the magnet 210. The table 213 can be positioned (what is known as table movement), in particular along the axial direction A and optionally also within geometric limitations along directions perpendicular thereto (radial direction B). A layer 62 of the object to be examined 211 is illustrated. With movement of the table the location of the layer 62 within the tube 209 moves in the axial direction A. The table 213 can be positioned for example at a continuous speed along the axial direction A, what is known as continuous table movement. It may then be possible to acquire MR data without interrupting positioning.

The MR system 230 also comprises a gradient system 214 for generating magnetic field gradients which are used for imaging and for the spatial encoding of acquired MR data. The gradient system 214 typically comprises at least three separately controllable coils or sets of coils which make it possible to apply and switch gradient fields along certain directions (gradient axes). The corresponding coils are designated channels of the gradient system 214 (layer selection, phase selection, frequency selection). The corresponding techniques are known to the person skilled in the art. Nominally the gradient fields should have a linear spatial dependency. This may be the case to only a limited extent, however, for example owing to technical inaccuracies or inherent physical regularities. Therefore non-linearities of the gradient fields may occur. Within the field of view 52 the non-linearities of the gradient fields can lie within a range suitable for measuring, i.e. satisfy for example nominal specifications of the MR system 230.

To excite the polarization which results in the basic magnetic field or to align the magnetization a high frequency (HF) coil assembly 215 is provided which can radiate an amplitude-modulated HF excitation pulse into the person being examined 211 to move the magnetization from the rest position (typically parallel to the basic magnetic field), i.e. to generate a transversal magnetization. A high frequency generator 220 and an amplitude modulation unit 224 are used to generate such HF excitation pulses. A gradient unit 223 is provided for control of the gradient system 214. The units 220, 223 and 224 can in particular be operated so as to be synchronized as a transmitting system 226 for targeted excitation of the transversal magnetization. A computer unit 222 of a receiving system 225 receives signals from the relaxing transversal magnetization (for example spin echoes and gradient echoes). The computer unit 222 is coupled for this purpose to HF receiving coils. In a particularly simple embodiment the HF coil 215 is used for both transmitting and receiving. Separate HF transmitting coils and HF receiving coils may be used, however.

A control unit 212 allows the input from and output to a user of the MR system 230. The control unit 212 can include for example a screen, keyboard, mouse, storage media, data links, etc.

A scanning controller 227 is also provided which enables MR measuring sequences for the acquisition of MR data and positioning of the table 213 to be purposefully carried out, for example by controlling the components 225, 226. It is possible to acquire MR data in this way. The scanning controller 227 can include a computer unit which enables processing of the acquired MR data, in order, for example, to determine distortion-reduced MR data by way of an embodiment of inventive methods.

The units of the MR system 230 are illustrated and discussed separately in FIG. 1. Certain units can be combined and/or functionally integrated, however, for example as hardware and/or software. This can relate in particular to the scanning controller 227 for example which can be part of a central computer of the MR system 230 for example.

Figure 2:
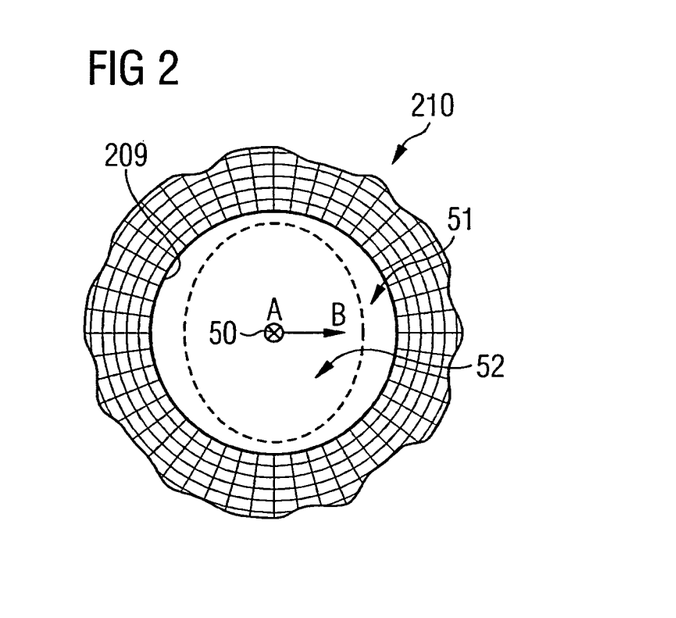
FIG. 2 illustrates a field of view and a subarea of an MR system in a sectional view perpendicular to the axial direction of the MR system.

The non-linearities of the gradient fields and/or the inhomogeneities in the basic magnetic field can typically be limiting for the option of generating significant MR images from acquired MR data. These values within the field of view 52, see FIG. 2, can typically lie within an acceptable tolerance range. In particular the field of view 52 can be smaller than a diameter of a tube 209 of the magnet 210 of the MR system 230. FIG. 2 shows a section perpendicular to the axial direction of the tube 209. The sectional view in FIG. 2 includes the isocenter 50 and is taken along line II-II' in FIG. 1.

Figure 3:
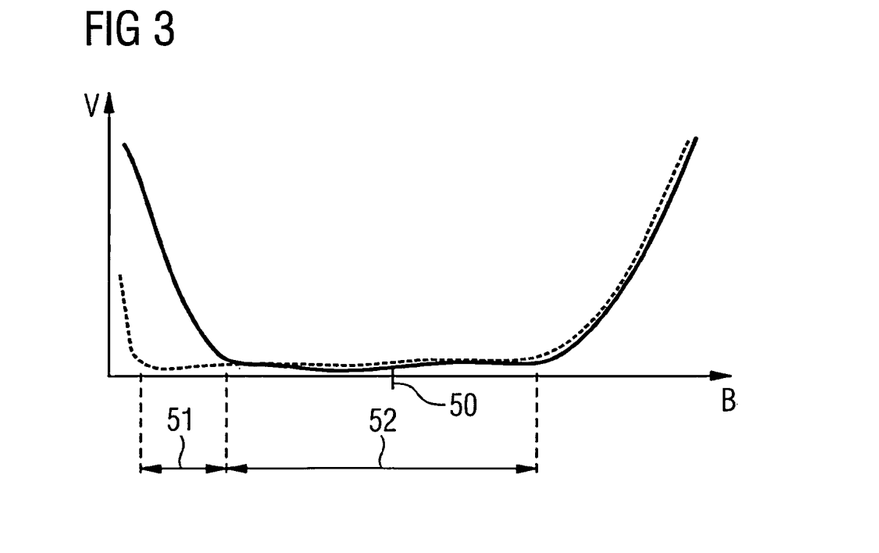
FIG. 3 illustrates distortions in the MR data as a function of a position along the radial direction of the MR system within and outside of the field of view.

The field of view 52 of the MR system 230 can have different geometries depending on construction and type. For this reason as well the diagram in FIGS. 1 and 2 should not be interpreted as limiting. Outside of the field of view 52, in the direction of greater radial spacings, is located a subarea 51 which adjoins the field of view 52 and surrounds it. In conventional MR systems 230, MR data, which is acquired in the subarea 51, can already exhibit significant local distortions. This is illustrated in FIG. 3. In FIG. 3 the distortion V is plotted along the radial direction B (solid line). As may be seen from FIG. 3 the local distortions V increase significantly at points which are located outside of the field of view 52 within subarea 51. The severity of the distortions V can be given for example by an amount of an image space transformation, which quantifies the spatial imprecision of the image. For example, an MR image obtained from MR data with significant distortion V cannot be used, or can only be used to a limited extent, for certain applications owing to distortions, translations and rotations.

Figure 4:
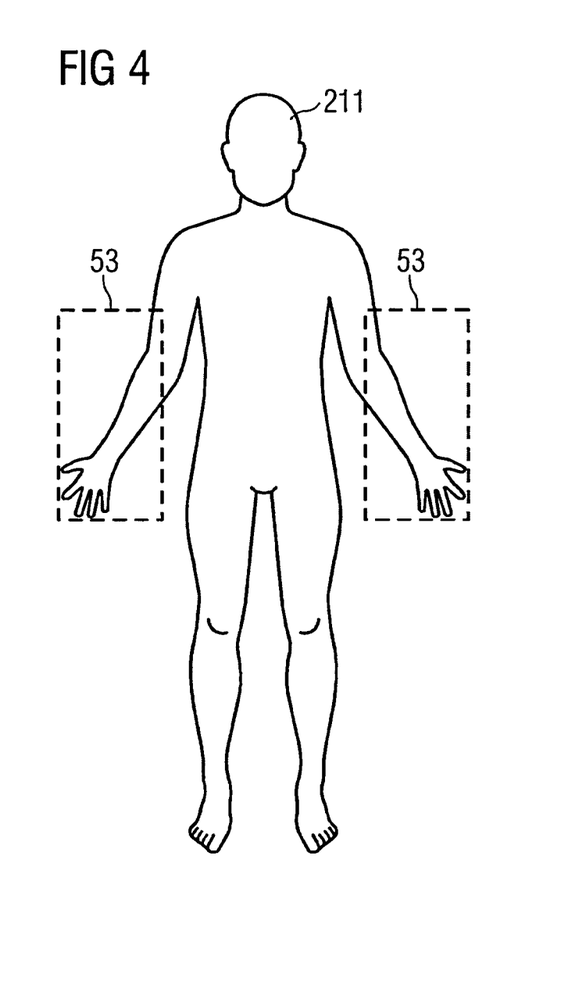
FIG. 4 illustrates an object to be examined.

By way of embodiments of the inventive methods, it may be possible to reduce the distortions V in subarea 51 (broken line). As a result it may be possible to acquire MR data for sample areas 53 of the person being examined 211 as well, these areas being arranged at the edge of the person being examined 211 (see FIG. 4). The sample areas 53 can include for example the arms of the person being examined 211. Whereas in FIG. 3 a reduction in the distortions V is shown only on one side of subarea 51 (on the left in FIG. 3), according to the invention it may also be possible to provide distortion-reduced MR data which adjoin the field of view 52 to the left and right. Based on such MR data, the human attenuation correction in the case of PET imaging for example can be made with increased accuracy (in particular in comparison with the case where there is no MR data available for the sample area 53). Inventive methods for determining distortion-reduced MR data (see for example broken line in FIG. 3) in subarea 51 will be illustrated below.

Figure 5:
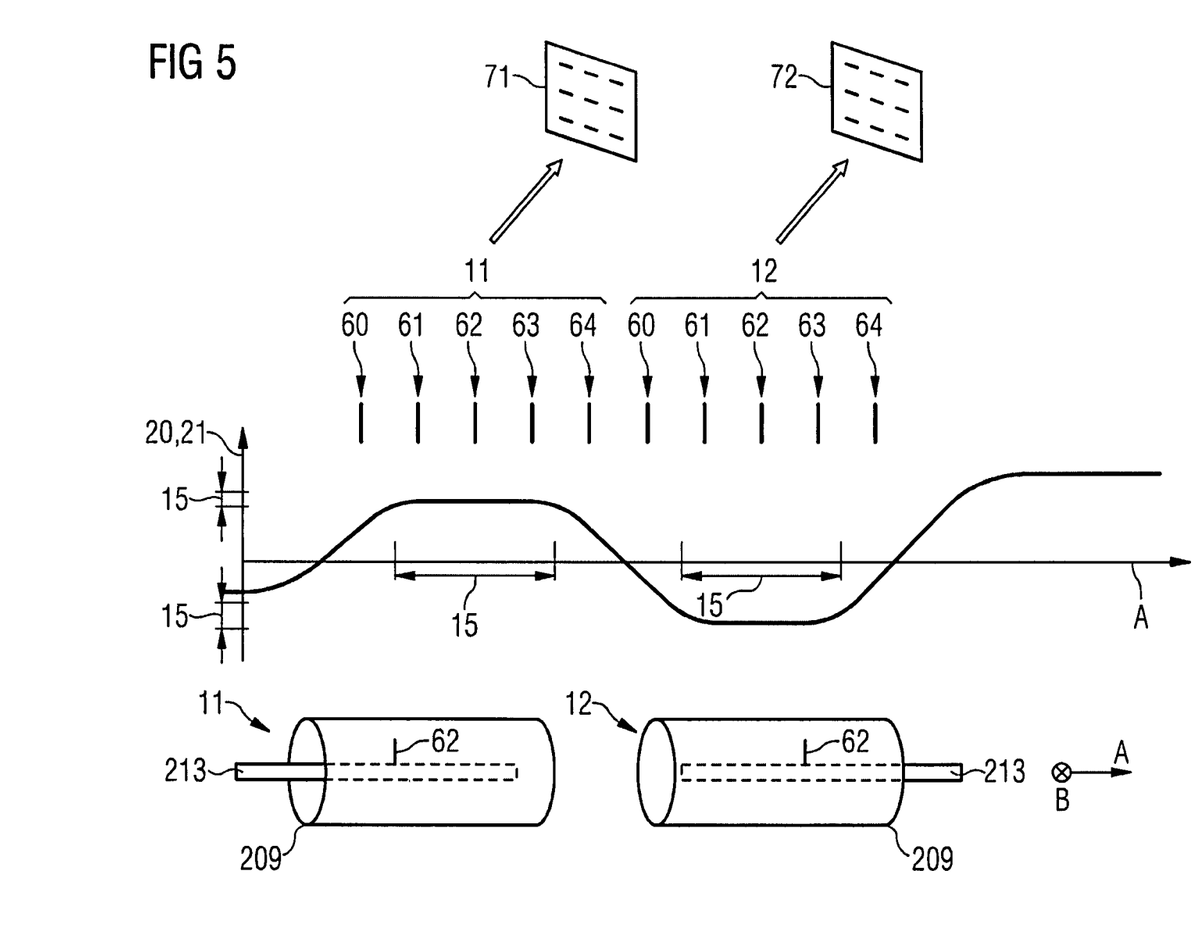
FIG. 5 illustrates a spatial dependency of non-linearities of the gradient fields and of inhomogeneities in the basic magnetic field, and locations of a large number of layers for which first and second MR data are detected, for first and second positions along the axial direction of the MR system.

With reference to FIG. 5, according to an embodiment of the invention, first MR data 71 and second MR data 72 (illustrated schematically at the top in FIG. 5) are acquired respectively for layer 62 of the object to be examined 211 for example at first and second positions 11, 12. Between the first and second positions 11, 12 the object to be examined 211 is positioned along the axial direction A of the MR system 230 by moving the table 213 (illustrated schematically at the bottom in FIG. 5). As a result the layer 62 is located in the first position 11 at a location within the MR system 230 at which the inhomogeneities in the basic magnetic field 20 and/or the non-linearities of the gradient fields 21 have for example a positives sign (randomly defined) and/or a designated value. By positioning the object to be examined 211 at the second position 12 the layer 62 can be positioned such that the non-linearities of the gradient fields 21 and/or the inhomogeneities in the basic magnetic field 20 have a negatives sign (same definition as above) and/or the same designated value at the corresponding location in the MR system 230. This can be seen from FIG. 5 since at the location of layer 62 in the first or second position 11, 12 the solid line has a different sign and approximately the same value (amount).

In particular the value or sign of the inhomogeneities in the basic magnetic field 20 and/or the non-linearities of the gradient fields 21 can be crucially decisive for the severity and type of local distortion behavior V of the MR data 71, 72. Purely by way of illustration and example a positive value, for example, of the inhomogeneities in the basic magnetic field 20 for the first MR data 71, which is acquired at the first position 11, can cause a compression, whereas the opposite sign can cause an elongation for the second MR data 72 at the second position 12. In general however the transformation behavior is more complicated and there may be for example an overlaying of various transformations (elongation and compression, rotation, scaling, translation, etc.). For this reason it may generally be desirable to determine the first and second positions 11, 12 in such a way, that the distortion behavior V of the first MR data 71 and the second MR data 72 is substantially cancelled out. The distortion-reduced MR data can then be obtained for example by averaging the first and second MR data 71, 72. Such substantially cancelling distortion behavior V can for example be given if the inhomogeneities 20 and/or non-linearities 21 for the first and second MR data 71, 72 have substantially the same amounts and a different sign. In other words, the sign inhomogeneities in the basic magnetic field 20 at the respective location within the MR system 230, at which the first and second MR data 71, 72 respectively of the at least one layer 62 are acquired, can be different in the first position 11 and the second position 12. The same applies to the sign of the non-linearities of the gradient fields 21. However, the values of the inhomogeneities in the basic magnetic field 20 and/or the non-linearities of the gradient fields 21 at the respective location within the MR system 230, at which the first and second MR data 71, 72 respectively of the at least one layer 62 are acquired, can be equal within a tolerance range 15 in the first and second position 11, 12. The tolerance range 15 can be determined for the positions along the axial direction A and for the inhomogeneities/non-linearities 20, 21.

In many MR measuring sequences it can be desirable that distortion-reduced MR data is acquired not just for one layer 62 but for a large number of layers 60-64. In a simple embodiment it may be possible to ensure this by repeated positioning of the table 213. Each of the layers 60-64 can then namely be positioned at a corresponding, and, for example, identical, location within the MR system 230, so the criteria discussed above in relation to FIG. 5 for the non-linearities of the gradient fields 21 and the inhomogeneities in the basic magnetic field 20 are met. Such a method may be comparatively time-consuming, however.

For this reason it may also be possible in various embodiments to acquire first and second MR data 71, 72 respectively for the large number of layers 60-64 (only layers 60-64 are shown in FIG. 5) at the first position 11 and the second position 12. This may be possible through the use of corresponding spatially encoded gradient fields, for example layer selection gradient fields, without repositioning of the table 213. The locations at which the first and second MR data 71, 72 are acquired for layers 60-64 are then different. For example a relative spacing between the respective locations may be the same for all layers 60-64, however.

It may be possible for example to acquire the first and second MR data 71, 72 for the layers 60-64 in which the inhomogeneities in the basic magnetic field 20 and/or the non-linearities of the gradient fields 21 at the respective location in the MR system 230, at which the first and second MR data 70, 71 are acquired, are within a tolerance range 15 in the first and second positions 11, 12. This is identified in FIG. 5 by the vertical or horizontal markings. It may therefore be seen from FIG. 5 that for the layers 61-63 the values of the inhomogeneities in the basic magnetic field 20 and/or the non-linearities of the gradient fields 21 vary only slightly within the tolerance range 15. At the location of the layers 60, 64 the values of the inhomogeneities in the basic magnetic field 20 and/or the non-linearities of the gradient fields 21 differ significantly, however, and lie outside of the tolerance range 15. In this way it may be possible to acquire the first and second MR data 71, 72 selectively for these layers 61-63 at the first and second positions 11, 12 of the table 213. The distortion-reduced MR data can then be determined from this first and second MR data 71, 72. For the layers 60, 64 the values of the inhomogeneities in the basic magnetic field and/or the non-linearities of the gradient fields 21 differ significantly from each other between the first and second positions 71, 72. In such a case the distortion behavior V between the first and second MR data 11, 12 may be significantly different for these layers 60, 64 or not have any particular relationship, so it is not possible, or may be possible to only a limited extent, to determine the distortion-reduced MR data from the first and second MR data 11, 12.

In relation to such methods it may in particular be possible to provide data which describes the inhomogeneities in the basic magnetic field 20 and/or the non-linearities of the gradient fields 21, for example as a function along the axial direction A. In other words, the data can describe the solid-line curve in FIG. 5. In such a case it may be possible to determine the first and second position 11, 12 with the aid of this data. Determination can occur for example such that the values of the inhomogeneities in the basic magnetic field 20 and/or the non-linearities of the gradient fields 21 at the respective locations of the layers 60-64 are equal with mutually different signs; in other words, the first and second positions 11, 12 can be determined such that a situation comparable to the scenario illustrated in FIG. 5 and described above is attained.

It may for example be possible to measure this data in advance or determine this data within the framework of a calibration routine before actual acquisition of the first and second MR data 71, 72. For example it may be possible by means of a magnetic field probe to quantify the inhomogeneities in the basic magnetic field 20 or the non-linearities of the gradient fields 21. Depending on the scenario it may also be possible to permanently set the first and second positions 11, 12; it may then not be necessary to provide the data.

Figure 6:
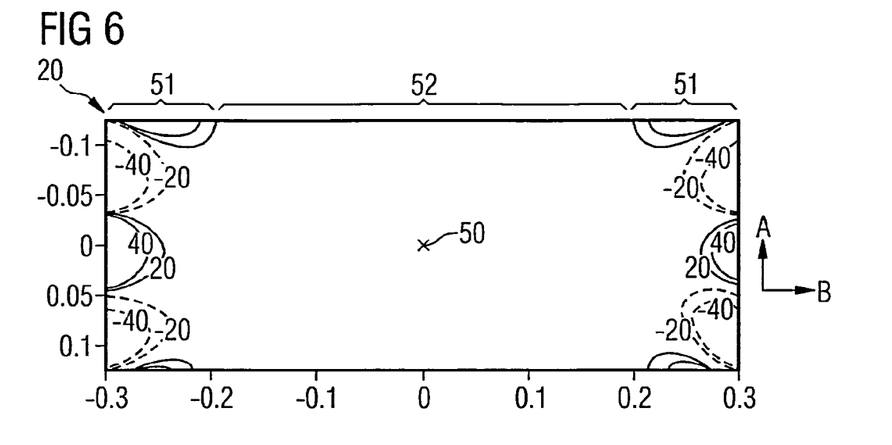
FIG. 6 illustrates inhomogeneities in the basic magnetic field in a two-dimensional view along the axial and a radial direction of the MR system.
Figure 7:
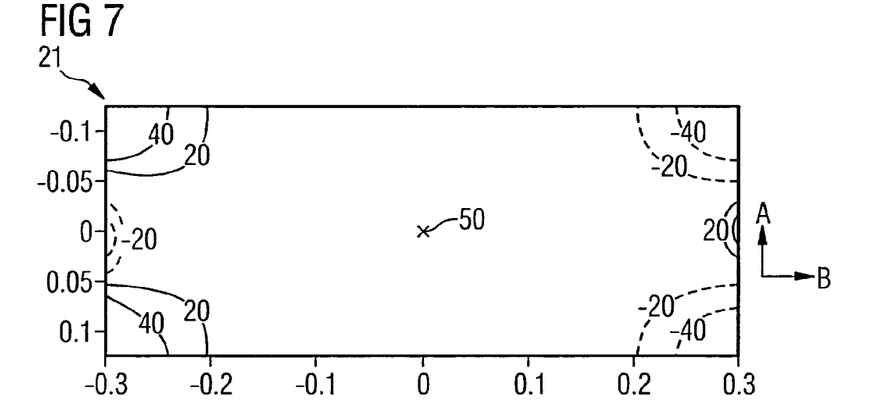
FIG. 7 illustrates non-linearities of gradient fields in a two-dimensional view along the axial direction and a radial direction of the MR system.
Figure 8:
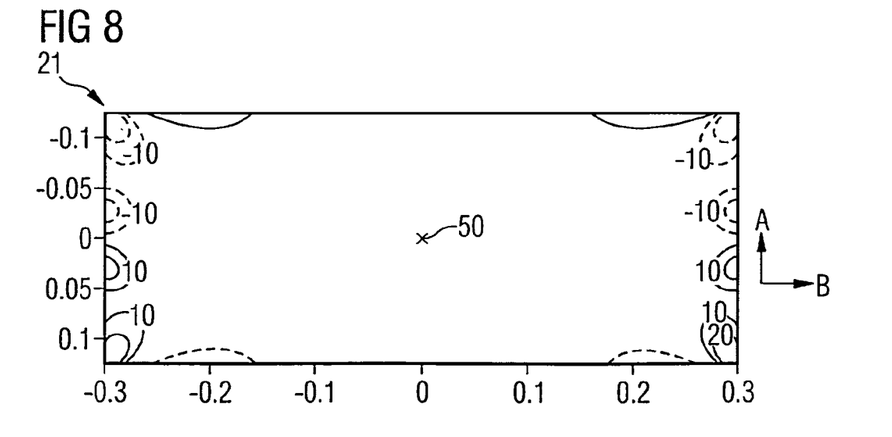
FIG. 8 illustrates non-linearities of further gradient fields in a two-dimensional view along the axial direction and a radial direction of the MR system.

FIG. 6 shows such determined data for the inhomogeneities in the basic magnetic field 20 in a two-dimensional diagram along the axial direction A and the radial direction B as an isocontour plot (solid lines: equal positive values; broken lines: identical negative values). FIGS. 7 and 8 show corresponding data for the non-linearities of the gradient fields 21; in particular FIG. 7 shows a component along the x direction (radial direction B) of non-linearities, while FIG. 8 shows a component along the z direction (axial direction A) of non-linearities. As may be seen from FIGS. 6-8, the inhomogeneities in the basic magnetic field 20 or the non-linearities of the gradient fields 21 increase at greater distances from the isocenter 50. On such a basis it may be possible for example to determine the section 51 and the field of view 52 of the MR system 230. Furthermore, the sign of the inhomogeneities in the basic magnetic field 20 or the non-linearities of the gradient fields 21 has an oscillating behavior as a function of the position along the axial direction A. This oscillating behavior matches the behavior discussed above in relation to FIG. 5.

Figure 9:
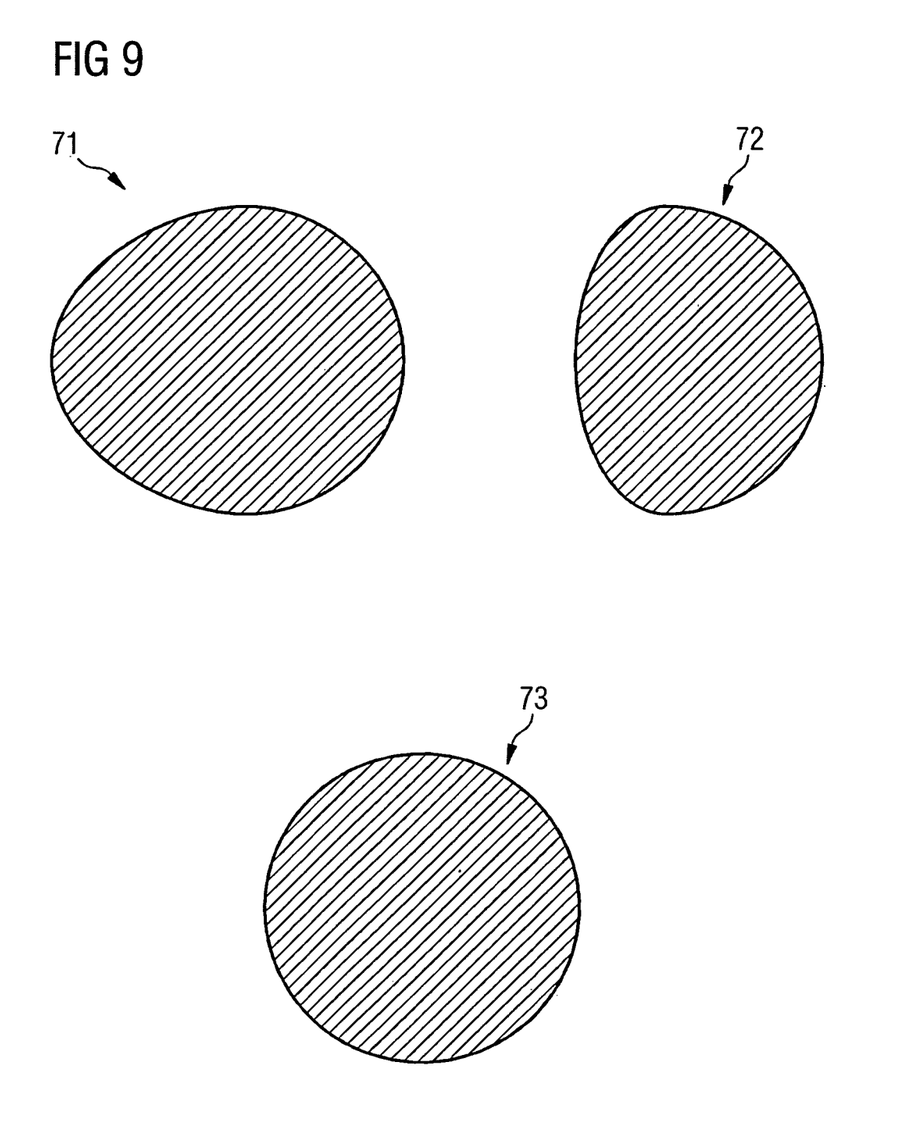
FIG. 9 schematically illustrates the determination of distortion-reduced MR data from first and second MR data.

FIG. 9 illustrates the determination of distortion-reduced MR data 73. FIG. 9 schematically illustrates at the top MR images based on the first and second MR data 71, 72, which has been acquired at the first and second positions 11, 12. The actual round object in FIG. 9 appears stretched in the first MR data 71, whereas it appears compressed in the second MR data 72. In other words, the first and second MR data 71, 72 exhibit distortions V. Based on the first and second MR data 71, 72 it is possible, for example by averaging the MR data 71, 72, to determine the distortion-reduced MR data 73. For example in a particularly simple embodiment the distortion-reduced MR data 73 can be obtained by addition of the first and second MR data 71, 72.

Figure 10:
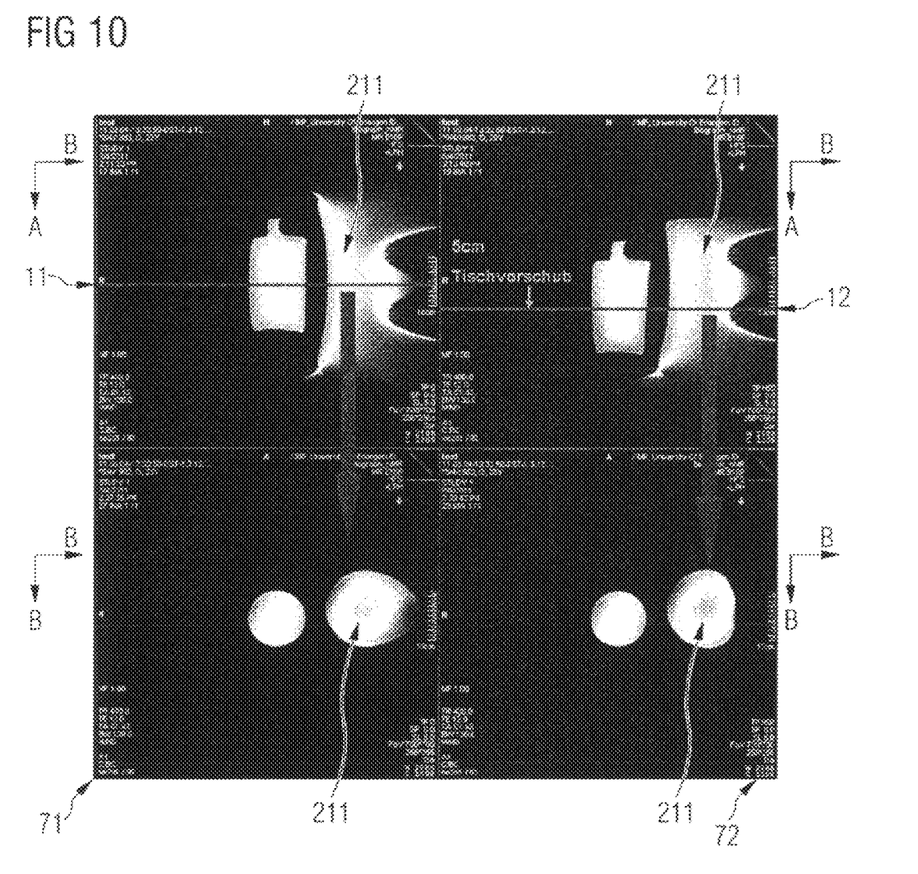
FIG. 10 illustrates measured first and second MR data which has been acquired at first and second positions.

FIG. 10 shows corresponding measurement data. Shown at the top is a view of an object to be examined 211 for various positions along the axial direction A. The horizontal solid line illustrates the first and second positions 11, 12 respectively. Shown at the bottom on the left is the first MR data 71, i.e. at the first position 11, while the right-hand side shows the second MR data 72 at the second position 72. It can be seen from FIG. 10 that the distortion behavior V of the first and second MR data is different with opposing dependency since the first MR data 71 reproduces a stretched object to be examined 211, while the second MR data 72 reproduces a compressed object to be examined 211.

Figure 11:
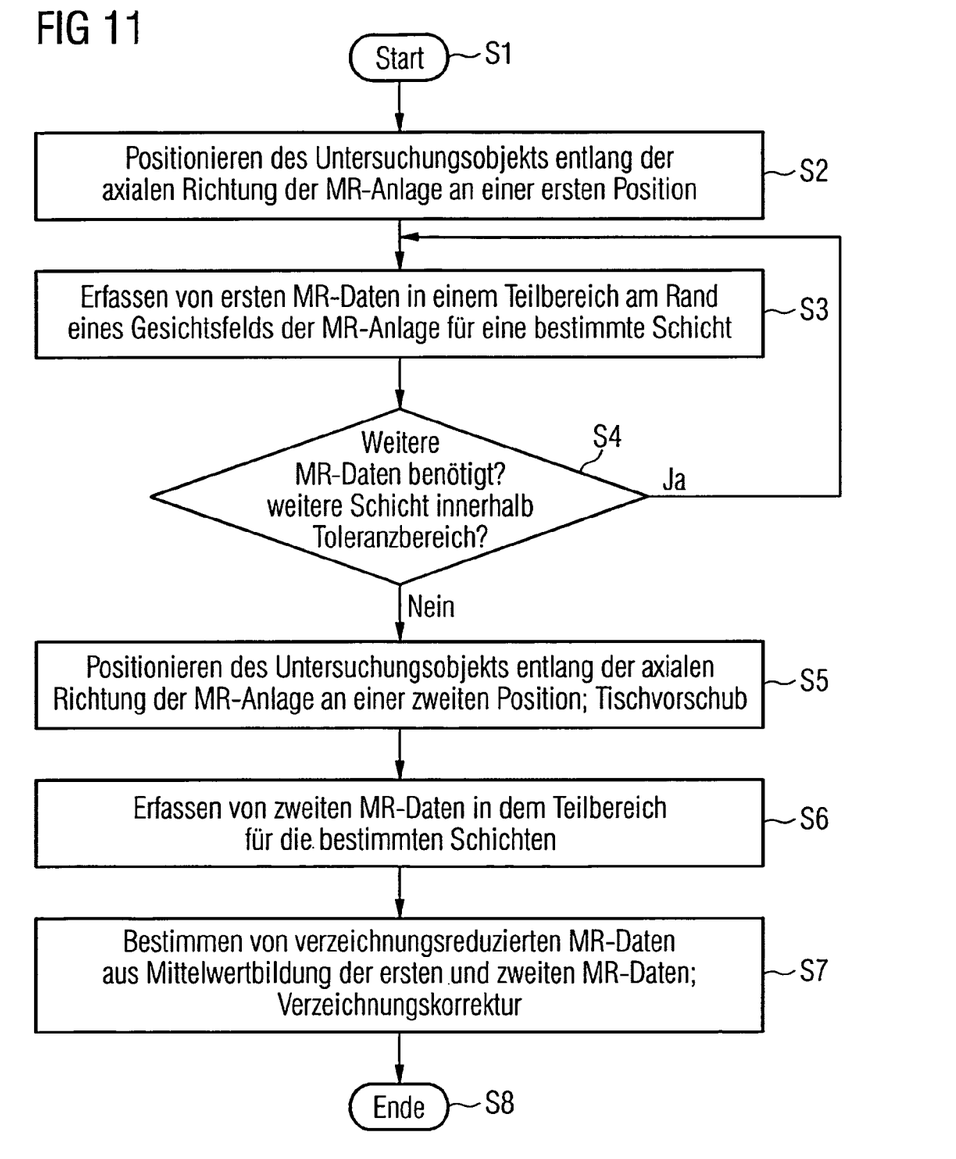
FIG. 11 shows a flow diagram of an embodiment of an inventive method for determining distortion-reduced MR data.

FIG. 11 shows a flow diagram of a method for determining the distortion-reduced MR data 73. The method begins with step S1.

Firstly the object to be examined 211 is positioned along the axial direction A at the first position 11. This can be done by moving the table 213 (step S2). For example the positioning in step S2 can be based on provided data which is indicative of the inhomogeneities in the basic magnetic field 20 and/or the non-linearities of gradient fields 21, for example as a function along the axial direction A. The table 213 can be positioned such that these values 20, 21 at the first position are equal to a predetermined value. The first position can alternatively also be set in advance.

In step S3 the first MR data 71 is acquired from the subarea 51 for a certain layer, for example layer 62 from FIG. 5. The MR data can be acquired using any MR measuring sequence, for example a Dixon measuring sequence.

It is then checked in step S4 whether additional MR data will be required for additional layers and whether the values of the inhomogeneities in the basic magnetic field 20 and/or the non-linearities of the gradient fields 21 at the corresponding location are within the tolerance range 15 (see FIG. 5). Step S3 is optionally repeated for as long as additional first MR data 71 is required, and the respective layers in the first position 11 are located at locations within the MR system 230 in which the values of the inhomogeneities in the basic magnetic field 20 and/or the non-linearities of the gradient fields 21 lie within of the tolerance range 15.

The object to be examined 211 is then positioned in step S5 along the axial direction A in the second position 12. The positioning can again occur based on the provided data which is indicative of the inhomogeneities in the basic magnetic field 20 and/or the non-linearities of the gradient fields 21, for example as a function along the axial direction A. The table 213 can be positioned such that these values 20, 21 at the second position 12, in particular at the location of the at least one designated layer, are equal to an additional predetermined value. This additional predetermined value can for example be equal to the predetermined value from step S2, but have an opposing sign. It may also be possible for the second position 12 to be predetermined.

The second MR data 72 is then acquired in step S6 for all those layers for which first MR data 71 has been acquired in the iterative execution of step S3. Again any MR measuring sequence may be used. The MR measuring sequence which was used for acquisition of the first MR data in step S3 can advantageously be used.

In step S7 the distortion-reduced MR data 73 can be determined from the first and second acquired MR data 71, 72, for example from averaging of the first and second MR data 71, 72. This corresponds to a distortion correction since the distortions V in the first and second MR data 71, 72 can be respectively just or substantially cancelled out.

The method ends in step S8.

As an alternative to the embodiment in FIG. 11 positioning can also occur continuously, for example at a certain speed.

Of course the features of embodiments described above and aspects of the invention can be combined with each other. In particular the features can be used not only in the described combinations but also in other combinations or in isolation, without departing from the field of the invention.

What is claimed is:

1. A method for determining distortion-reduced magnetic resonance (MR) data for at least one layer of an object to be examined in a subarea of an MR system, the subarea being located along a radial direction of the MR system at an edge of a field of view of the MR system, the method comprising:
   positioning the object to be examined at a first position along an axial direction of the MR system;
   acquiring first MR data in the subarea for the at least one layer at the first position;
   positioning the object to be examined at a second position along the axial direction of the MR system, the second position being different from the first position;
   acquiring second MR data in the subarea for the at least one layer at the second position; and
   determining the distortion-reduced MR data for the at least one layer based on the acquired first and second MR data.

2. The method of claim 1, wherein at least one of:
   a sign of inhomogeneities in a basic magnetic field at the first position and at the second position is different, and
   a sign of non-linearities of gradient fields at at the first position and at the second position is different.

3. The method of claim 1, wherein at least one of
   an amount of inhomogeneities in a basic magnetic field is equal within a tolerance range at the first position and at second position; and
   an amount of non-linearities of gradient fields is equal within a tolerance range at the first position and at second position.

4. The method of claim 2, further comprising:
   providing data which describes at least one of the inhomogeneities in the basic magnetic field and the non-linearities of gradient fields within the subarea as a function of the position along the axial direction; and
   determining the first position and the second position based on the provided data.

5. The method of claim 1,
   wherein distortion behavior of the first MR data is substantially cancelled out by distortion behavior of the second MR data.

6. The method of claim 4,
   wherein, at the first position and the second position, first and second MR data are respectively acquired for a number of layers with different spatially-encoding gradient fields.

7. The method of claim 6, further comprising:
   determining the number of layers based on a comparison of the provided data with a tolerance range of at least one of the inhomogeneities in the basic magnetic field and the non-linearities of gradient fields for each layer of the respective number of layers.

8. The method of claim 1, wherein determining the distortion-reduced MR data includes a weighted averaging of the first and second MR data.

9. A magnetic resonance system comprising:
   a scanning controller, configured to determine distortion-reduced MR data for at least one layer of an object to be examined in a subarea of an MR system, the subarea being located along a radial direction of the MR system at an edge of a field of view of the MR system, the scanning controller being further configured to
   position the object to be examined at a first position along an axial direction of the MR system,
   acquire first MR data in the subarea for the at least one layer at the first position,
   position the object to be examined at a second position along the axial direction of the MR system, the second position being different from the first position,
   acquire second MR data in the subarea for the at least one layer at the second position, and
   determine the distortion-reduced MR data for the at least one layer based on the first and second MR data.

10. The magnetic resonance system of claim 9,
    wherein distortion behavior of the first MR data is substantially cancelled out by distortion behavior of the second MR data.

11. The method of claim 2, wherein at least one of
    and amount of inhomogeneities in a basic magnetic field is equal within a tolerance range at the first position and at the second position; and
    an amount of non-linearities of gradient fields is equal within a tolerance range at the first position and at second position.

12. The method of claim 3, further comprising:
    providing data which describes at least one of the inhomogeneities in the basic magnetic field and the non-linearities of gradient fields within the subarea as a function of the position along the axial direction;
    determining the first position and the second position based on the provided data.

13. The method of claim 11, further comprising:
    providing data which describes at least one of the inhomogeneities in the basic magnetic field and the non-linearities of gradient fields within the subarea as a function of the position along the axial direction; and
    determining the first position and the second position based on the provided data.

14. The method of claim 1,
    wherein, at the first position and the second position, first and second MR data are respectively acquired for a number of layers with different spatially-encoding gradient fields.

15. The method of claim 12,
wherein, at the first position and the second position, first and second MR data are respectively acquired for a number of layers with different spatially-encoding gradient fields.

16. The method of claim 15, further comprising:
determining the number of layers based on a comparison of the provided data with a tolerance range of at least one of the inhomogeneities in the basic magnetic field and the non-linearities of gradient fields for each layer of the respective number of layers.

17. The method of claim 13,
wherein, at the first position and the second position, first and second MR data are respectively acquired for a number of layers with different spatially-encoding gradient fields.

18. The method of claim 17, further comprising:
determining the number of layers based on a comparison of the provided data with a tolerance range of at least one of the inhomogeneities in the basic magnetic field and the non-linearities of gradient fields for each layer of the respective number of layers.

\* \* \* \* \*